United States Patent
Nakano et al.

(10) Patent No.: US 7,619,218 B2
(45) Date of Patent: Nov. 17, 2009

(54) CHARGED PARTICLE OPTICAL APPARATUS WITH ABERRATION CORRECTOR

(75) Inventors: Tomonori Nakano, Kokubunji (JP); Takaho Yoshida, Higashimatsuyama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 207 days.

(21) Appl. No.: 11/698,819

(22) Filed: Jan. 29, 2007

(65) Prior Publication Data
US 2007/0181806 A1 Aug. 9, 2007

(30) Foreign Application Priority Data
Feb. 3, 2006 (JP) .............................. 2006-026500

(51) Int. Cl.
*H01J 37/26* (2006.01)
(52) U.S. Cl. .................. 250/306; 250/309; 250/310; 250/311; 250/396 ML
(58) Field of Classification Search ................. 250/306, 250/307, 308, 309, 310, 311, 396 R, 396 ML; 850/21, 26, 30, 33
See application file for complete search history.

(56) References Cited

U.S. PATENT DOCUMENTS

| 7,015,481 B2 | 3/2006 | Matsuya | |
|---|---|---|---|
| 2004/0119022 A1* | 6/2004 | Sato et al. | 250/396 R |
| 2005/0017194 A1* | 1/2005 | Matsuya et al. | 250/396 R |
| 2005/0167607 A1* | 8/2005 | Hosokawa | 250/396 R |
| 2005/0189496 A1* | 9/2005 | Uno | 250/396 R |
| 2007/0164228 A1* | 7/2007 | Frosien | 250/396 ML |

OTHER PUBLICATIONS

Nuclear Instruments and Methods in Physics Reseearch A 363 (1995), "Aberration correction in a low voltage SEM by a multipole corrector", J. Zach et al, pp. 316-325.

* cited by examiner

*Primary Examiner*—Jack I Berman
*Assistant Examiner*—Nicole Ippolito Rausch
(74) *Attorney, Agent, or Firm*—Mattingly & Malur, P.C.

(57) ABSTRACT

When an accelerating voltage and operating distance are changed, an excitation current and a pole voltage of an aberration corrector must also be changed. Moreover, different multipole voltages or currents must be added individually for each pole in order to superpose multipoles. In view of overcoming the problems explained above, the charged particle optical apparatus of the present invention comprises an excitation device including, to give excitation to form a multipole field to each pole of the multipole lens, electromagnetic type quadrupole of four stages arranged along an optical axis of charged particle beam, electromagnetic type quadrupole of two stages for superposing distribution of voltage similar to distribution of magnetic potential of the electromagnetic type quadrupole of two stages at the center of the electromagnetic type quadrupole of four stages, and electromagnetic type octupole for superposing magnetic potential at least to three multipoles among that of four stages and also comprises a first power supply group for driving the same excitation device and a second power supply group for impressing voltages.

10 Claims, 7 Drawing Sheets

CHARGED PARTICLE OPTICAL APPARATUS WITH ABERRATION CORRECTOR

CLAIM OF PRIORITY

The present application claims priority from Japanese application JP 2006-026500 filed on Feb. 3, 2006, the content of which is hereby incorporated by reference into this application.

FIELD OF THE INVENTION

The present invention relates to a technology to minimize the beam spot of an electron beam apparatus and more specifically to a scanning electron microscope (SEM), a critical dimension SEM (CD-SEM), and an electron beam drawing apparatus or the like.

BACKGROUND OF THE INVENTION

In an apparatus such as a critical dimension SEM for measuring pattern size of semiconductor device with higher accuracy, experience in use of ultra-fine device pattern in recent years requires attaining of resolution of about 3 to 1 mm using the electron beam in an accelerating voltage of 1 kV or lower in view of protecting a specimen. In order to satisfy the requirement explained above, a diameter of the electron beam (spot size) on the surface of specimen must be reduced to a size of the required solution or less.

As a method of realizing above requirement, attention is focused to an aberration reducing method using an aberration corrector. In the charged particle optical apparatus represented by an electron microscope such as an SEM and a transmission electron microscope (TEM), a lens utilizing an electric field or a magnetic field is surely used in order to focus the charged particle beam. A rotary symmetrical lens which is generally used as an electric field lens or a magnetic field lens inevitably generates an aperture aberration such as chromatic aberration and spherical aberration. Accordingly, even when the spot size of charged particle beam is narrowed by increasing resolution of lens, a high quality image cannot be attained under the condition that aberration of charged particle beam is high. Therefore, substantial limit of resolution of the charged particle beam is decided at present depending on aberration.

As a means for removing aberration of the charged particle beam, an aberration corrector has been proposed. An aberration corrector is usually constituted with plural multipole lenses arranged in multiple stages and removes aberration included in the charged particle beam passing the inside thereof by generating an electric field or a magnetic field within the multiple lenses.

A non-patent document 1 (Nuclear Instruments and Methods in Physics Research, A363 (1995), pp. 316 to 325) discloses an aberration corrector for SEM based on a system utilizing 12-pole lens of four stages. Moreover, a patent document 1 (Japanese Unexamined Patent Publication No. 2004-265864) discloses an aberration corrector wherein octupole lenses, decapole to dodecapole lenses are allocated in multiple stages. The non-patent document 1 and the patent document 1 explained above describe the aberration corrector in the structure that an electrostatic multipole lens is used in the first and fourth stages, while an electrostatic•electromagnetic type complex type multipole lens is used in the second and third stages. In these documents, the electron beam which has been freed from aberration with methods explained below has been obtained.

(1) The electrostatic multipole lens in the first stage isolates the incident electron beam to the predetermined reference trajectories (x and y trajectories).

(2) A complex type multipole lenses in the second and third stages respectively removes aberration of electron beams isolated into the x trajectory and y trajectory.

(3) An electrostatic multipole lens in the fourth stage combines the electron beams isolated into the x trajectory and y trajectory into one electron beam.

In these aberration correctors represented by the non-patent document 1, formation of trajectories and correction of aberration are mainly executed using the electrostatic multipole lens and the electromagnetic lens is used as a complementary means. The reason is that the electrostatic lens assures, in comparison with the electromagnetic lens, higher reproducibility, for example, in focusing of image under the same conditions and easier control even when the setting values are changed and reset again to the original values after axis and intensity of the multipole field is once adjusted.

SUMMARY OF THE INVENTION

For normal operations of an aberration corrector, it is necessary to apply a voltage or a current to plural poles or coils constituting a multipole lens. In the related art, it has been a matter of course to provide a drive power supply for operating the aberration corrector to each of plural poles. That is, the drive power supply for operating the aberration corrector has been required in the number corresponding to the number of poles. Meanwhile, a power supply (voltage source or current source) for aberration corrector is required to assure very high stability. An accelerating voltage of the charged particle beam used for SEM and backscattered electron microscope is considerably as high as several tens of kV to 100 kV at present. In current, a power supply which is capable of supplying, with the required stability, an electromagnetic field in such a degree as removing aberration of the charged particle beam having such higher energy is very expensive. Accordingly, in the case where the drive power supplies are provided in accordance with the number of poles, it is no longer possible to manufacture the SEM and backscattered electron microscope within the reasonable price. Therefore, it has been expected to realize the technology to reduce the number of power supplies without lowering of performance in correction of aberration.

FIG. 7B of the patent document 1 discloses the technique for reducing the number of current sources by providing plural current supplying amplifiers and then supplying currents from an amplifier instead of a current source to the poles. However, a problem of stability in amplifier arises in turn in the structure of FIG. 7B in the patent document 1. Since an amplifier which is capable of stably supplying a heavier current is very expensive at present, the problem explained above cannot be solved with the structure disclosed in FIG. 7B of the patent document 1.

Moreover, a fact that an aberration corrector is not resistive to noise when an electrostatic lens is used as a multipole lens for trajectory isolation has also been proved by experiments.

An object of the present invention is to provide a technique for providing, in lower price, a charged particle optical apparatus using an aberration corrector without deterioration in performance of aberration corrector.

An electromagnetic field type multipole lens has been considered undesirable as a lens used for isolation and synthesis of trajectories from a viewpoint of hysteresis of the generated magnetic field. On the other hand, in the SEM and backscattered electron microscope, the accelerating voltage actually used is ranged from about 1 kV to about 100 kV from the relationship between entry depth of the primary electron and secondary electron generating region. The inventors of the present invention has found, as a result of discussion, as experimental fact that when the accelerating voltage is within the range of about 1 kV to 100 kV, any problem does not occur even when the electromagnetic field type lens is used as the multipole lens for isolation and synthesis of trajectories.

According to one aspect of the present invention, an electromagnetic multipole lens is used for a multipole lens in the first stage to form trajectories isolated and a multipole lens in the final stage to synthesize the isolated trajectories in an aberration corrector provided with multipole lenses of the multistage structure. Therefore, the number of current sources can be reduced by allowing a common current to flow among the coils provided to each of multipoles.

In the case where plural multiple fields are superposed with electrostatic multipoles, a voltage to be supplied to multipole lens is expressed by sum of plural multipole voltages. However, the voltage value impressed to individual poles is all different respectively in 12 poles. Accordingly, a value of voltage impressed to poles must be set with a method of providing another power supply to each pole or a method of addition, subtraction, and inversion, etc. using an amplifier.

On the contrary, in the case where plural multipole fields are superposed with an electromagnetic multipole, it is only required to select a coil to be wound around the pole in accordance with a kind of the field generated. Usually, the coil is insulated and excitation currents are never mixed with each other among the coils allocated to plural poles. Therefore, in the case where the electromagnetic multipole lens is used, it is enough when only the required number of current sources are provided in accordance with the number or kind of the multipole fields generated (or distribution based on the amplifier). When different coils are arranged to individual pole of the multipole lens (when the coils of different applications are arranged for only one pole), the same number of power supplies as that required for the electrostatic multipole lens are required.

The coil to be wound around the pole can be increased in the kind thereof in accordance with the number of magnetic fields superimposed in the multipole lens (for example, dipole field, quadrupole field, or the like). In this case, it is desirable to supply the current to be applied to different kinds of coils from different current sources from the viewpoint of stability in the current source.

In the region sandwiched by the multipole lenses in the first stage and the final stage, an electrostatic—electromagnetic complex type multipole lens is arranged to remove aberration of the trajectory x and trajectory y. The number of current sources can be reduced by connecting also a common current source to the complex type lens arranged in this region in accordance with a kind of magnetic field generated. In this case, a voltage source of the voltage impressed to the pole to generate an electric field can also be used in common.

Thereby, in the case of electromagnetic lens, the power supply connected can be reduced in principle, only to one current source, while in the case of the complex type multipole lens, such power supply connected can be reduced to a couple of current source and voltage source in the multipole lens in each stage. The number of power supplies can effectively reduced by supplying the current source and voltage source from a complex power supply provided with both the current source and voltage source.

According to another aspect of the present invention, beam spot can be minimized by correcting chromatic aberration and spherical aberration in a charged particle optical apparatus in which the charged particle beam is focused and then radiated to a specimen.

Since the electromagnetic multipole field of the aberration corrector is driven with an exclusive power supply respectively for dipole, quadrupole, hexapole, and octupole fields, operation performance can be improved in higher stability.

DETAILED DESCRIPTION OF THE PREFERRED EMBODIMENTS

First Embodiment

A first embodiment of the present invention will be explained with reference to the accompanying drawings.

Figure 1:
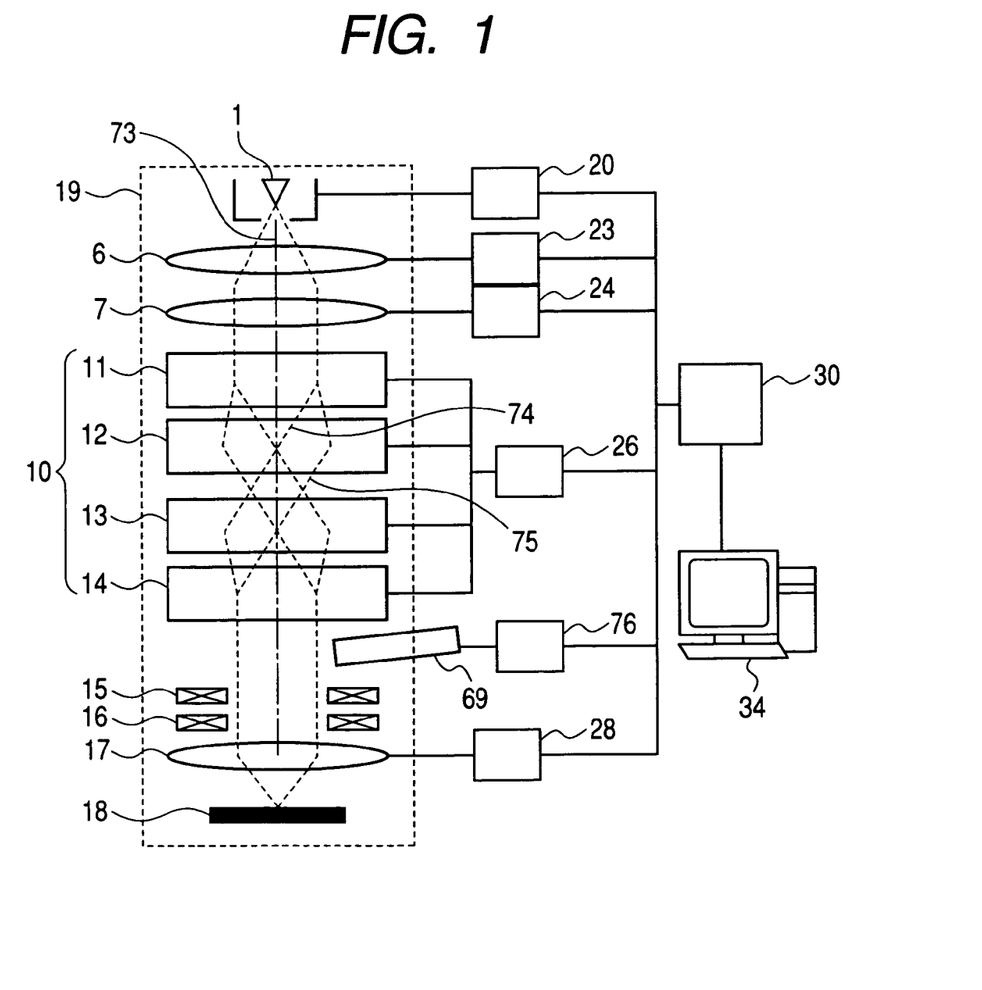
FIG. 1 is a diagram schematically showing a structure of an example of an electron beam apparatus with aberration corrector to which the present invention is applied.

FIG. 1 shows an embodiment of a scanning electron microscope (SEM) which is capable of correcting chromatic aberration. In FIG. 1, the principal elements of an electronic optical system of SEM are indicated. The electron beam emitted from an electron source 1 focuses cross-over at the adequate location for an objective lens 17 after adjustment in amount of beam current with a converging lenses 6 and 7. This electron beam is further projected with demagnification projection to the surface of a specimen 8 using the objective lens 17 to attain beam probe. Amount of secondary electron generated by irradiation of electron is allocated for each location at the surface of specimen by scanning the beam probe at the specimen surface with deflection coils 15, 16 to obtain so-called "scanning electron microscope image (SEM image)" through visualization. The elements which are not required principally in the present invention such as a secondary electron detector, a specimen stage for holding specimen and an aperture device for limiting beam aperture angle are eliminated in FIG. 1.

In the optical system explained above, the aberration corrector 10 is installed between the converging lens 7 in the lower stage and the objective lens 17 in order to mainly correct aberration of the objective lens 17. The aberration corrector 10 of this embodiment is basically structured with a multiple stage multipole lens and is at least a four-stage multipole lens which can generate the electromagnetic field at least with the first and fourth stages and the quadrupole field with the second and third stages through electromagnetic complex structure. In the structure of FIG. 1, the multipole lenses 11, 12, 13, and 14 of the first to fourth stages are provided. In principle, only four poles are enough for generation of the quadrupole field, but it is also possible to superpose plural electromagnetic fields by increasing the number of poles through alteration of arrangement relationship of poles.

A charged particle optical apparatus including the aberration corrector 10 is supported with a cabinet 19. Moreover, the cabinet 19 simultaneously maintains vacuum condition and air-tightness and keeps the electron beam path in the vacuum condition with a vacuum evacuation apparatus added thereto. In principle, an electron source 1 and a specimen 18 are allocated within this vacuum condition and the end portions of electrode of the multipole lenses 11, 12, 13, and 14 of the aberration corrector 10 must be exposed within the vacuum condition. A power supply 26 is prepared for functioning the multiple lenses 11, 12, 13, and 14. The power supply 26 is structured with plural power supplies in accordance with the number of multipole fields formed by the relevant multipole lens. For example, only one unit of current source is necessary to form the quadrupole field, for example, with only one dodecapole lens and one additional one current source is required to form the octupole field.

Moreover, when it is attempted to superpose the dipole, hexapole, and octupole fields in view of correcting spherical aberration, parasitic aberration and high-order aberration, the current sources are required in the number equal to the number of multipole fields to be superposed. Here, the dipole and hexapole fields respectively include orthogonal two elements and these two orthogonal elements are calculated as different multipole fields. The power supply 26 is arranged at the external side of the cabinet 19 and is connected with each electrode with the relationship based on the multipole field symmetry with the pole within the cabinet. In addition, the voltage source/current source in this embodiment is controlled with a compute 34 such as a personal computer via a controller 30. When an operator of the charged particle optical apparatus inputs as required optical setting conditions from an input device such as a keyboard associated incorporated to the computer 34, this computer 34 calculates potential of each electrode and excitation of magnetic pole satisfying such setting conditions from the reference trajectory setting condition and aberration correcting condition explained above in order to generate the power supply 26, and predetermined current and voltage via the controller 30. Since such control process is monitored and displayed on a display device such as incorporated CRT with the computer 34.

In the apparatus of the structure shown in FIG. 1, the electron source 1, condenser lenses 6, 7, objective lens 17 as the optical element of the SEM in nature are connected respectively with the power supplies 20, 23, and 28 as the driving object and each power supply is controlled with the controller 30.

Figure 2:
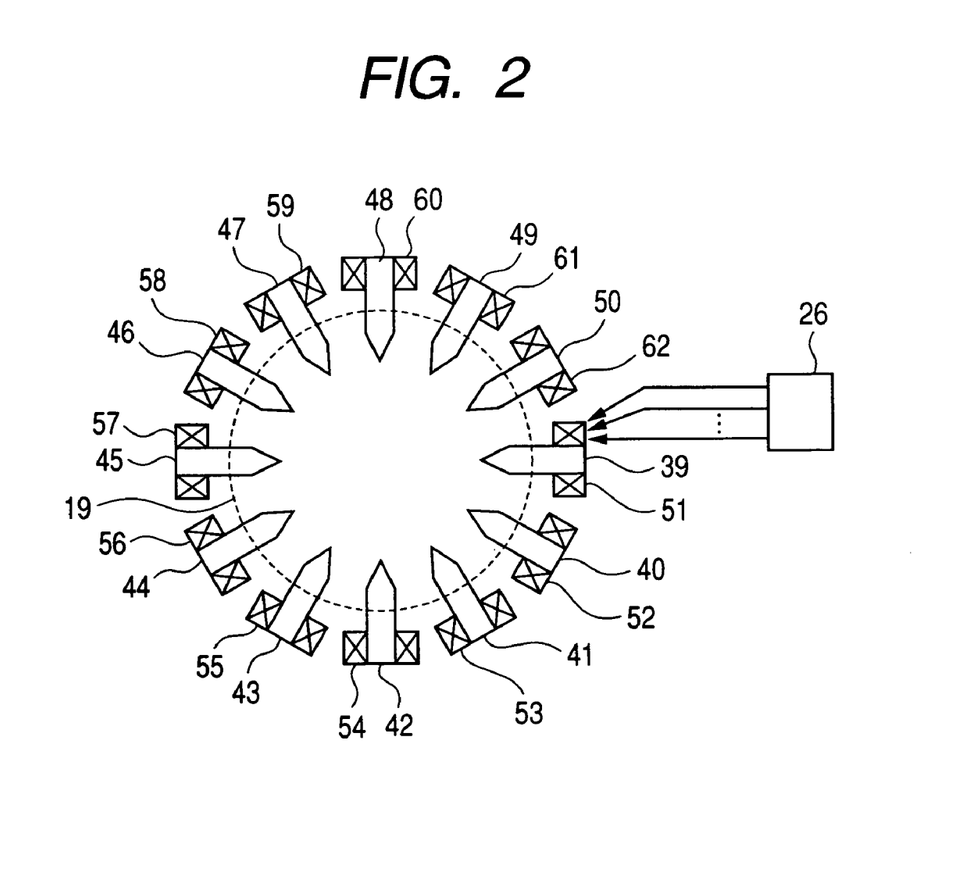
FIG. 2 shows an example of structure of an electromagnetic multipole lens of the aberration corrector.

FIG. 2 is a structural diagram showing a structure of the electromagnetic multipole lens in this first embodiment. The electromagnetic multipole lens shown in FIG. 2 corresponds to multipole lenses 11 and 14 of FIG. 1. The multipole lens of FIG. 2 is structured with plural poles from 39 to 50 arranged in the circular format. Correction of chromatic aberration requires generation of the quadrupole field, but it is enough, in principle, that four poles are provided in order to generate the quadrupole field. For example, the quadrupole field can be generated by providing the poles arranged at the positions for the four-rotation symmetry like the poles 39, 42, 45, and 48 as shown in FIG. 2. However, a certain correcting magnetic field must be applied to the field generated with a reason such as a mechanical error in arrangement of poles. Therefore, in the electromagnetic lens shown in FIG. 2, a correcting magnetic field is applied using the poles 40, 41, 43, 44, 46, 47, 49, and 50 using the poles arranged at the positions for 12-rotation symmetry. In the following explanation, "multipole field" means the electric field, or magnetic field or electromagnetic field generated by the multipole lens. Unless otherwise specified particularly, the "multipole field" appearing in the explanation of the electromagnetic field lens means the multipole magnetic field and "multipole field" appearing in the explanation of the complex lens means the electromagnetic field.

The poles 39 to 50 is formed of a magnetic material such as permalloy and iron and the coils 51 to 62 are arranged for exciting the poles. Although not shown in FIG. 2, the pole 39 is provided with a current inputting terminal for supplying an excitation current of the coil. Moreover, the coils provided among the poles 39 to 50 are provided with conductive wires and thereby the current supplied from the current input terminal may be applied to each coil as the common current. In this embodiment, the pole 39 is provided with the current input terminal, but any of the poles among the poles 39 to 50 may be provided, in principle, with the current input terminal. Moreover, although not shown in FIG. 2, rings formed of a magnetic material such as permalloy and iron are arranged to the external circumference of poles for coupling the magnetic paths. A dotted line 19 in FIG. 2 means a cabinet 19 of FIG. 1 and the end part of pole is inserted into the cabinet 19 with feed-through not shown in FIG. 2. Accordingly, in regard to the poles 39 to 50, only a part for generating an electric field or a magnetic field is arranged within a vacuum region in the cabinet 19. A structure of the aberration corrector in this embodiment where the coils are arranged in the outside of vacuum region assures easier maintenance work in comparison with the aberration corrector of the structure where coils are arranged within the vacuum region and is advantageous from the aspect of cooling the coils generating heat due to the excitation current.

Figure 3:
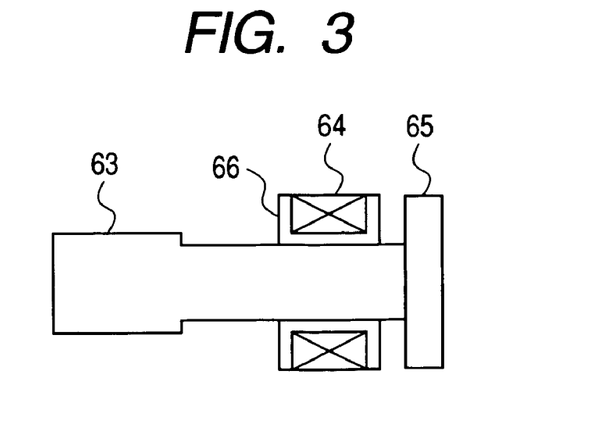
FIG. 3 shows an example of structure of pole of the electromagnetic multipole lens.

FIG. 3 is a cross-sectional view of a pole forming a multipole lens of FIG. 2. The end part of pole forms a magnetic pole 63 and is arranged within a vacuum region in the cabinet 19. At the root of pole, a magnetic path ring 65 is arranged to form a magnetic path of a magnetic flux generated by excitation. An excitation coil 64 is wound around the region sandwiched by a structuring part of magnetic pole 63 and the magnetic path ring and plural coils are arranged in accordance with the number or kind of the field to be superposed. A structuring material of coil 64 is a conductive wire which is insulated by a holding member 66 from the core part of the pole. The coil 64 is connected with the conductive wire to the coils arranged to the adjacent poles. Such conductive wire is provided among all poles 39 to 50 and finally connected to the current input terminal provided to the pole 39. Accordingly, a current supplied from the current source (or power supply) may be applied in common to each coil.

Figure 4:
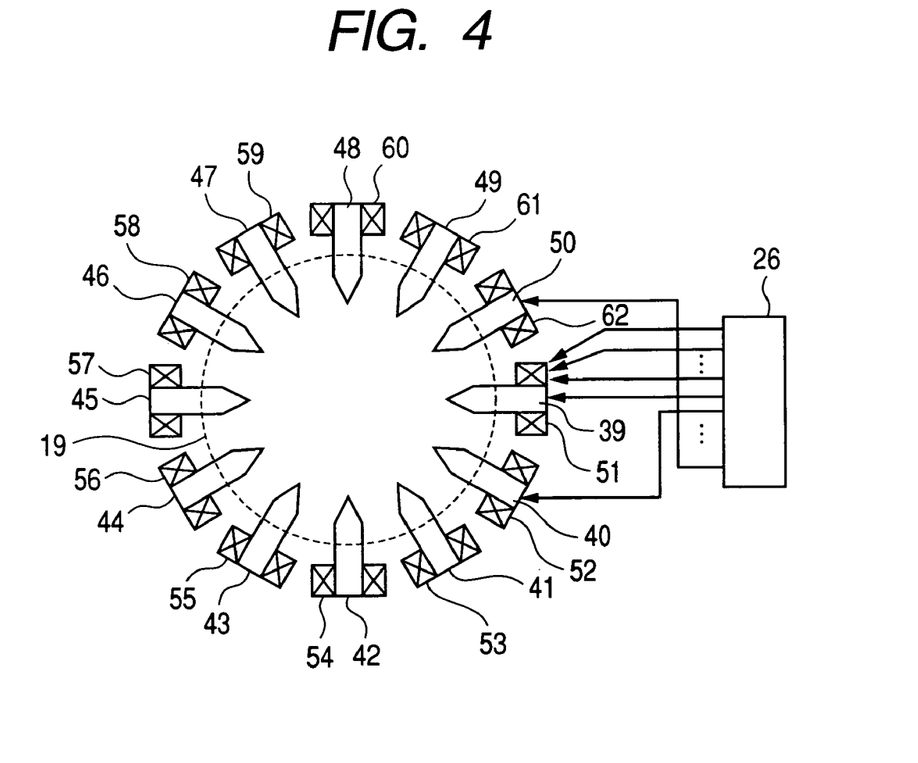
FIG. 4 shows an example of structure of an electrostatic and electromagnetic complex type multipole lens of the aberration corrector.

Next, a structure of the electromagnetic•electrostatic type complex type multipole lens will be explained. FIG. 4 is a cross-sectional view of the complex type multipole lens forming the second the third stages of the aberration corrector 10 of FIG. 1. Arrangement of poles and total structure of multipole lens are almost same as that of the electromagnetic multipole lens of FIG. 2. Therefore, explanation thereof is omitted here.

Figure 5:
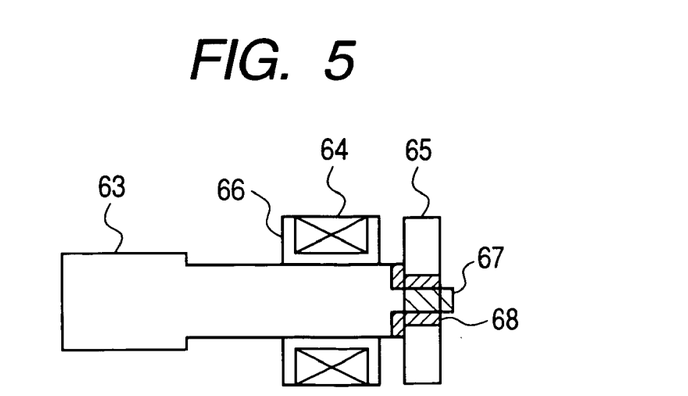
FIG. 5 shows an example of structure of the electromagnetic and electrostatic complex type multipole lens.

FIG. 5 is a cross-sectional view in the vertical direction of the pole forming the complex type multipole lens of FIG. 4. A structure of the pole is also almost similar to that of the electromagnetic type multipole lens, but is different therefrom in provision of the voltage input terminal. Referring to FIG. 5, the structure of the complex type multipole lens is similar to the structure of the pole explained with reference to FIG. 3 in the points that the end part 63 of pole structures a magnetic pole and it is arranged in the vacuum region in the cabinet 19, the magnetic path ring 65 is arranged, the excitation coil 64 is wound, and plural coils are arranged in accordance with the number of kind of the field to be superposed. Meanwhile, the pole 63 for the complex type multipole lens is provided with a voltage input terminal 67 because an electric field must be generated in addition to a magnetic field. The voltage input terminal is connected with a voltage source and the end part 63 of pole releases an electric field with the voltage supplied from the voltage source. Therefore, the end part 63 of pole shown in FIG. 5 also works as an electric field releasing part and as a magnetic pole. Accordingly, in the complex type multipole lens of this first embodiment, the electric field releasing part and magnetic pole area arranged within the vacuum region. The voltage input terminal 57 and pole 63 are insulated from the magnetic path ring 65 with the insulating material 68 and moreover insulated from a current flowing into the coil 66 with a holding member 66 of the coil.

The voltage impressed to each pole of the multipole lens of FIG. 5 in order to generate a quadrupole field is as follows. When a voltage of the pole 40 is defined as $z[V]$, the poles 41, 46, and 47 have the voltage $z[V]$, while the poles 39, 42, 45, and 48 have the voltage $0[V]$, and the poles 43, 44, 49, and 50 have the voltage $-z[V]$.

As explained above, a scanning electron microscope which can eliminate chromatic aberration may be realized with less number of power supplies than that required for the related art. The beam spot size can be reduced by about 10% from that in the related art. In addition, the structure explained above may also be applied not only to the scanning electron microscope but also to a backscattered electron microscope and an exposure apparatus.

Second Embodiment

In the first embodiment, the scanning electron microscope which can correct chromatic aberration has been explained but the charged particle beam generated by an electronic optical system includes spherical aberration in addition to chromatic aberration and such spherical aberration must also be eliminated in order to further converge the beam spot.

Moreover, a kind of aberration occupying a greater part in the charged particle beam is different depending on an accelerating voltage. In the SEM and backscattered electron microscope, the accelerating voltage used actually is ranged from about 1 kV to about 100 kV and the range from several hundreds volts to about 10 kV of the accelerating voltage is called the low acceleration region and the range from 10 kV to 100 kV thereof is called the high acceleration region. Here, in the low acceleration region, the charged particle beam includes both chromatic aberration and spherical aberration almost in the equal rate. On the other hand, in the high acceleration region, contribution by chromatic aberration is reduced and spherical aberration occupies a greater part as the accelerating voltage increases. At present, adjustment of aberration corrector is very complicated and adjustment method is different in the chromatic aberration and spherical aberration. Accordingly, if it is possible to change a kind of aberration to be eliminated in the low acceleration region and high acceleration region, it is very advantageous for adjustment of aberration corrector.

Figure 6:
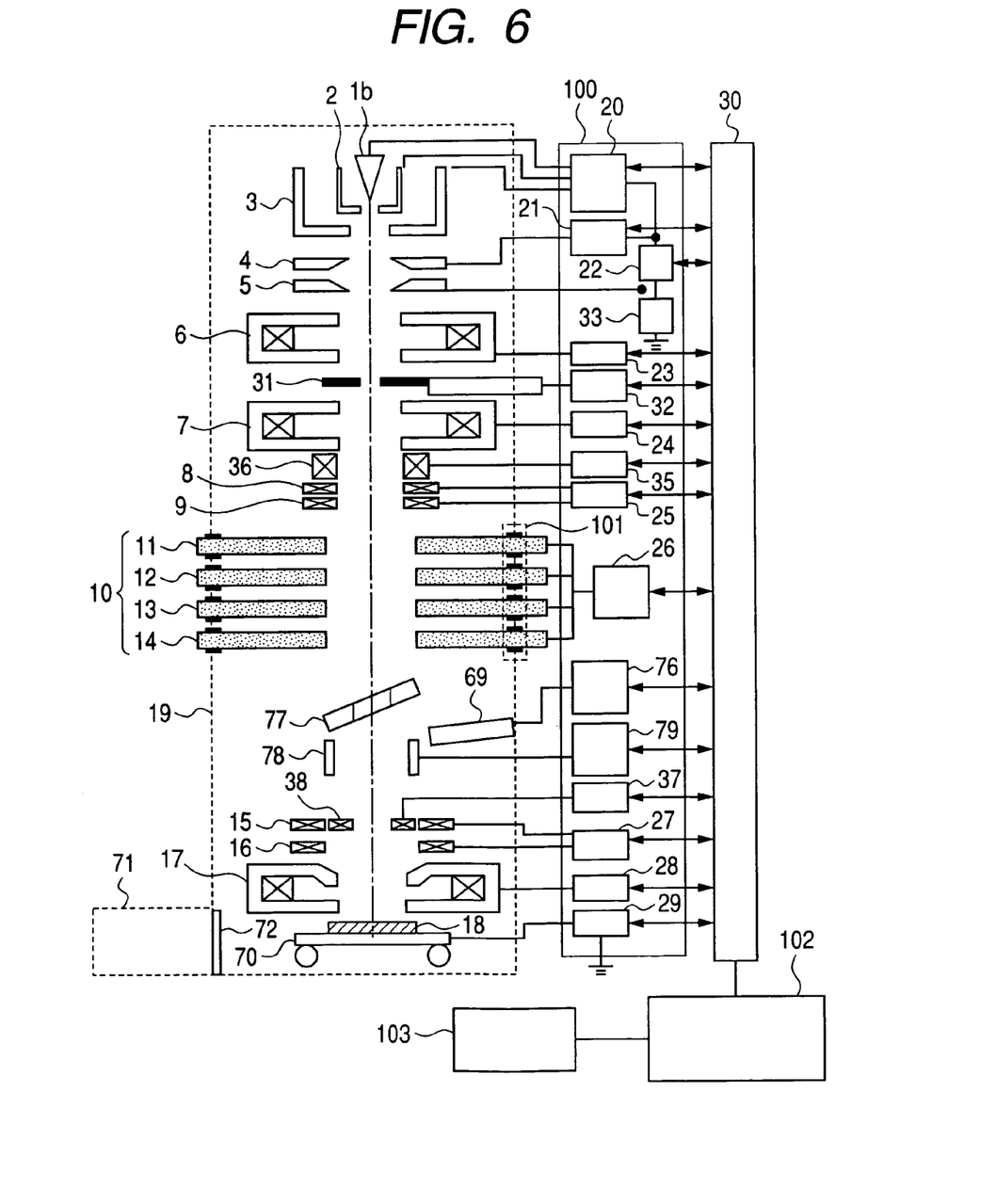
FIG. 6 shows an example of structure of a scanning charged particle optical apparatus of a second embodiment.

FIG. 6 is a schematic diagram showing a structure of a scanning charged particle optical apparatus of this second embodiment. The scanning charged particle optical apparatus shown in FIG. 6 is provided with a function to eliminate both chromatic aberration and spherical aberration. Moreover, this apparatus is also provided with a critical dimension function and inspecting function of circuit patterns. The scanning charged particle optical apparatus of FIG. 6 roughly comprises an electronic optical system, a specimen chamber, a specimen exchanging chamber 71, a power supply unit 100, an electronic optical system control unit 30, an image processing device 102, and a management terminal 103 or the like. The management terminal 103 is structured with an information inputting means such as a keyboard and a mouse and an image displaying means such as a monitor. Each part of apparatus will be explained in separation for each of roughly classified structural units.

The electronic optical system can roughly be classified into structural elements such as an electron gun, a lens system, an aberration correcting part, a scanning deflecting part, and an image focusing optical system. The electron gun comprises an electron source 1, a suppressor electrode 2, a leadout electrode 3, a first anode 4, and a second anode 5, etc. A Schottky electron source 1b utilizes the Schottky effect by diffusing oxygen and zirconium to single crystal of tungsten and allows setting of the suppressor electrode 2 and the leadout electrode 3 in the adjacent area thereof. The Schottky electrons may be released from the Schottky electron source 1 by heating the Schottky electron source 1 and impressing a voltage of about +2 kV across the leadout electrode 3 and the Schottky electron source 1. A negative voltage is impressed to the suppressor electrode 2 in order to suppress electrons released from a part other than the end part of the Schottky electron source 1. The electrons released from the hole of the leadout electrode 3 is accelerated and converted with an electrostatic lens formed of the first anode 4 and the second anode 5.

The lens system comprises a first condenser lens 6, a second condenser lens 7, an upper deflection coil 8, a lower deflection coil 9, a condenser aperture 31, and an astigmatism correcting coil 36, etc. The charged particle beam having passed the lens system is restricted in the beam spot with the first condenser lens 6 and the condenser aperture 31 and enters the aberration corrector 10 in the predetermined angle passing through the second condenser lens 7, upper deflection coil 8 and lower deflection coil 9.

The aberration correcting part is structured with the aberration corrector 10 and a feed-through 101. In the aberration corrector in this second embodiment, the end part of pole forming a multipole lens is inserted into the vacuum cabinet 19 and an exciting part of pole (provided with a coil) is arranged at the external side of the vacuum cabinet 19. The feed-through 101 is a member used for making conductive the pole to internal and external sides of cabinet 19. Details will be explained later. The aberration corrector 10 is finally capable of eliminating aberration from the charged particle beam reaching the specimen when it is given aberration inverted from that generated in the lens system of the subsequent stage. From the viewpoint of a structure, the multipole lens 11, complex type multipole lens 12, complex type multipole lens 13, and multipole lens 14 are arranged with the optical axis defined as the common axis.

On the occasion of correcting chromatic aberration, the quadrupole magnetic field is formed with the multipole lenses 11 and 14 within the plane perpendicular to the optical axis, while the quadrupole electric field and quadrupole magnetic field are formed with the complex type multipole lenses 12 and 13. The quadrupole magnetic field is distributed to form a field rotated by 45 degrees around the center of the optical axis within the x-y plane for the quadrupole electric field. The quadrupole electric field and the quadrupole magnetic field may be formed using the quadrupole, octupole, or dodecapole electrode (which may also be worked as the magnetic pole).

In the case of correcting not only chromatic aberration but also spherical aberration, the octupole field is also required in addition to the quadrupole field and the quadrupole and octupole field are generated with the above electrodes and are then superposed. In this case, the multipole lens requires the octupole and dodecapole. The electron beam given the chromatic aberration and spherical aberration which are cancelled with the objective lens 17 by the aberration corrector 10 is converged and scanned on the specimen 18 with the objective lens 17 passing through the upper scanning coil 15, and lower scanning coil 16 forming the scanning deflecting part. An objective aligner 38 is used for fine adjustment of the location of charged particle beam inputted to the objective lens.

As the objective lens 17, a magnetic field type, or electric field type or electric field/magnetic field complex type rotary symmetry lens is used. In some cases, a voltage is applied to the specimen 18 with a retarding power supply 29 to decelerate the electrons between the specimen 18 and the objective lens 17 in view of reducing aberration by preventing breakdown of the specimen due to the electron beam.

The secondary electron and reflected electron emitted from the specimen through irradiation of the charged particle beam are deflected with an ExB filter 78 and is separated from the trajectory of primary charged particle beam. The secondary electron or reflected electron having passed the ExB filter 78 is then reflected by a reflector 77 and reaches a detector 69. The detection signal of the detector is transmitted to the computer 102 via a control part 30 and visualized as an image.

At the time of exchanging a specimen, the specimen 18 is carried up to a specimen exchanging chamber 71 with a movable stage 70. The cabinet 19 and specimen exchanging chamber 71 are connected with a gate valve 72 and therefore the specimen 18 can be exchanged while maintaining the vacuum condition of the cabinet 19.

Components of the electronic optical system are all stored in a vacuum vessel 19. Moreover, drive voltage or drive current of each component of the electronic optical system is supplied with the power supply unit 101 comprising various kinds of current sources and voltage sources (20 to 29). The power supply unit 101 and each component of the electronic optical system are electrically connected through connectors. A method of supporting each component in the vacuum vessel 19 has been omitted for simplifying the drawing. The power supply unit 101 is controlled by an electronic optical system control part 30 and moreover information and control sequence required for control are set via the computer 102 and information inputting means 103.

Next, a structure of the aberration corrector used in this second embodiment will be explained in detail. A total structure of the aberration corrector in this second embodiment is of the 4-stage structure where a couple of complex type multipole lenses are held with a couple of static magnetic field type multipole lenses. The structures themselves of the static magnetic type multipole lens and complex type multipole lens in this second embodiment are almost similar to the structure of the lens explained with reference to FIG. 2 and FIG. 4. However, the structure of pole forming the multipole lens is different for the requirement of superimposing the pole fields of different kinds.

Figure 7:
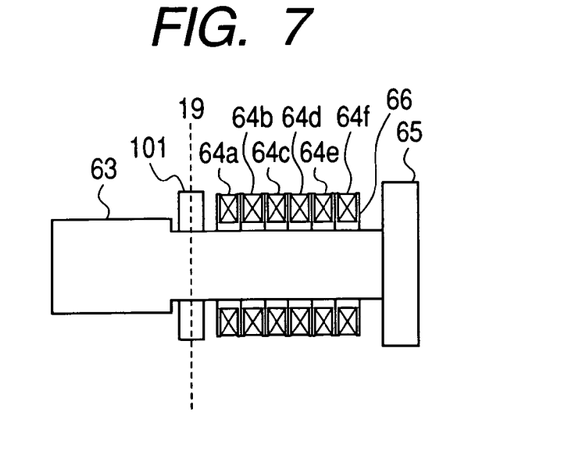
FIG. 7 shows an example of structure of an electromagnetic multipole lens of the second embodiment.

FIG. 7 is a cross-sectional view of a pole forming the static magnetic field type multipole lens in this second embodiment. The end part of the pole forms the magnetic pole 63 and is arranged within the vacuum region in the cabinet 19. At the root of pole, a magnetic path ring 65 as the magnetic path of the magnetic flux generated by excitation is arranged. A dotted line in FIG. 7 indicates the cabinet 19 of the vacuum vessel and the end part of the pole is inserted into the cabinet 19 via the feed-through 101. The excitation coil 64 is wound around the region sandwiched by the structural part of the magnetic pole 63 and the magnetic path ring and plural coils are arranged in accordance with the number or kind of the fields to be superposed. In the multipole lens using the poles shown in FIG. 7, three kinds of magnetic fields of the dipole field, quadrupole field, and hexapole field can be superposed and total of six coils of coil 64a for quadrupole, coil 64b for octupole, coil 64c for dipole, coil 64d for dipole, coil 64e for hexapole and coil 64f for hexapole are arranged. The structural material of the coils 64a to 64f are conductive wire which is insulated with each holding member 66. The structure in this second embodiment where the coils 64a to 64f are insulated with an insulating material assures higher maintenance ability in comparison with the aberration corrector in the related art and allows replacement of only defective coils when the coil wire is broken, resulting in short adjusting period. Moreover, the structure of the aberration corrector of this embodiment where the coils are arranged at the region outside the vacuum region is advantageous from the viewpoint of cooling the heat generated in the coil due to the excitation current. Superposing of the dipole and hexapole fields is aimed at correcting deviation of electron beam from the axes of the quadrupole and octupole lenses as a complementary role of correction of aberration. In order to correct deviation of electron beam from the axes of the quadrupole and octupole lenses, correction in two directions is necessary on the lens plane perpendicular to the axis. However, for correction of the multipole lenses in the second and third stages, correction in two directions is not always required because of line focus.

Each coil 64 is connected in serial only to the adjacent multipole coils of the same kind. Therefore, conductive wires for connecting among the coils of the same kind are provided in accordance with the number and kind of the coils arranged for the poles. For example, the quadrupole coil 64a among the coils 51 (coils provided for the pole 39) of FIG. 2 is connected in series with the coil 64a among the coils 52 of pole 40. The conductive wires for realizing such connecting relationships are provided among the poles 39 to 50 and finally connected to a current input terminal provided to the pole 39. Accordingly, the current supplied from the current source (or power supply) can be supplied in common to each coil.

The coils 64a to 64c are wound in different number of turns and in different winding direction for each pole in order to generate multipole fields. Relationship between the number of turns and winding direction is adjusted so that the number of turns of coil 64a is specified by the following equation (1) when the phase of pole y (39 to 50) is defined as x (x=1 to 12) under the condition that the coil 64a is wound with the number of turns of $m_1$ while the phase x is 0 (x=0) with reference to the pole 39.

$$m_1 \cdot \text{Cos}\left(\frac{x}{3} \cdot \pi\right) \quad (1)$$

In the same manner, the number of turns when the octupole coil 64b is wound with the number of turns of $m_2$ with reference to the pole 39 is set as follows.

$$m_2 \cdot \text{Cos}\left(\frac{2x}{3} \cdot \pi\right) \quad (2)$$

Similarly, the number of turns when the dipole coil 64c is wound with the number of turns of $m_3$ with reference to the pole 39 is set as follows.

$$m_3 \cdot \text{Cos}\left(\frac{x}{6} \cdot \pi\right) \quad (3)$$

The number of turns when the dipole coil 64d is wound with the number of turns of $m_4$ with reference to the pole 42 is set as follows.

$$m_4 \cdot \text{Sin}\left(\frac{x}{6} \cdot \pi\right) \quad (4)$$

The number of turns when the hexapole coil 64e is wound with the number of turns of $m_5$ with reference to the pole 39 is set as follows.

$$m_5 \cdot \text{Cos}\left(\frac{x}{2} \cdot \pi\right) \quad (5)$$

Moreover, the number of turns when the hexapole coil 64f is wound with the number of turns of $m_6$ with reference to the pole 42 is set as follows.

$$m_6 \cdot \text{Sin}\left(\frac{x}{2} \cdot \pi\right) \quad (6)$$

When the sign is inverted, the winding direction is also inverted for the reference. Moreover, the value under the decimal point in the number of turns is approximated.

Next, a structure of the electromagnetic type•electrostatic type complex multipole lens used this second embodiment will be explained. As is explained above, arrangement of poles and structure itself of the complex type multipole lens of this second embodiment are almost identical to that of the lens explained with reference to FIG. 4.

Figure 8:
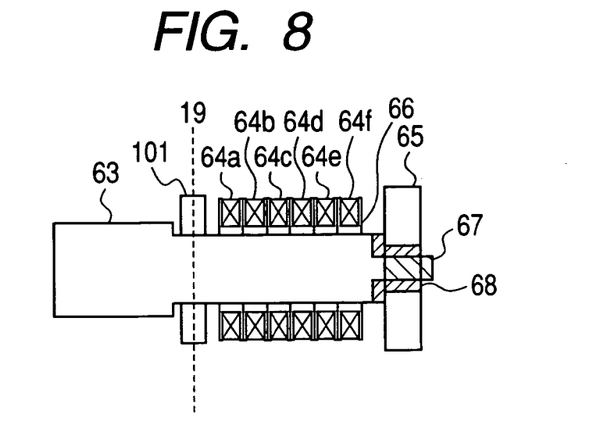
FIG. 8 shows an example of structure of the electromagnetic and electrostatic complex type multipole lens of the second embodiment.

FIG. 8 shows a cross-sectional view in the vertical direction of the pole forming the complex type multipole lens of FIG. 4. A structure of the pole is also almost similar to that of the electromagnetic type multipole lens but is different therefrom in the point that a voltage input terminal is provided. The structure of the complex type multipole lens will be explained with reference to FIG. 8. The structure is identical to that of pole of FIG. 7 in the points that the end part 63 of pole forms a magnetic pole and is arranged within the vacuum region in the cabinet 19, the magnetic path ring 65 is arranged, the excitation coil 64 is wound, and plural coils are arranged in accordance with the number and kind of the fields to be superposed. On the other hand, the pole 63 for complex type multipole lens is provided with a voltage input terminal 67, because an electric field must be generated in addition to the magnetic field. A voltage source is connected to the voltage input terminal and the electric field is emitted from the end part 63 of the pole with the voltage supplied from the voltage source. Accordingly, the end part 63 of pole shown in FIG. 8 also works as the electric field releasing part and magnetic pole. Therefore, in the complex type multipole lens in this second embodiment, the electric field releasing part and magnetic pole are arranged in the vacuum region. The voltage input terminal 67 and pole 63 are insulated from the magnetic path ring 65 with an insulating material 68 and is further insulated from the current flowing into the coil 66 with a holding member 66 of the coil.

At the pole of FIG. 8, total of six coils of coil 64a for quadrupole, coil 64b for octupole, coil 64c for dipole, coil 64d for dipole, coil 64e for hexapole, and coil 64f for hexapole are arranged. Each coil 64a to 64f is structured with a conductive wire and is insulated with each holding member 66. The structure in this second embodiment where the coils 64a to 64f are insulated with the insulating material assures higher maintenance ability in comparison with the aberration corrector in the related art and if the coil fails due to disconnection of conductive wire, adjustment time can be reduced because only the defective coil can be exchanged.

The coils 64a to 64c are wound with different number of turns in different winding direction for each pole in order to generate multipole. Relationship between the number of turns and winding direction conforms to 26. Voltage distribution of poles 39 to 50 in this case is as follows. When a voltage of the pole 40 is defined as z[V] only with the quadrupole voltage, the poles 40, 41, 46, and 47, as z[V], the poles 40, 41, 46, 47, as 0[V], and poles 43, 44, 49, and 50, as −z[V], respectively. With the structure explained above, the scanning charged particle means apparatus which can correct both chromatic aberration and spherical aberration can be realized.

Figure 9:
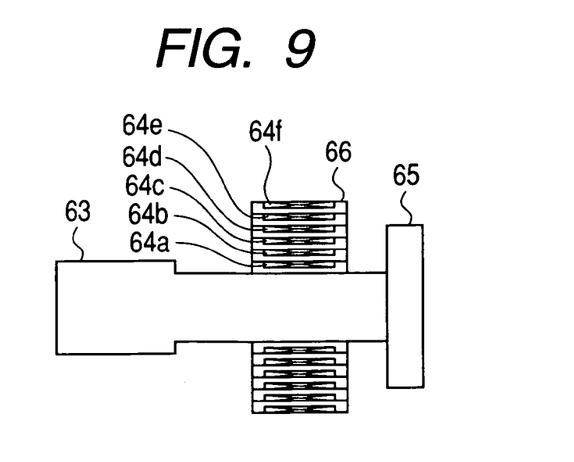
FIG. 9 shows an example of the other structure of the pole of the electromagnetic multipole lens.
Figure 10:
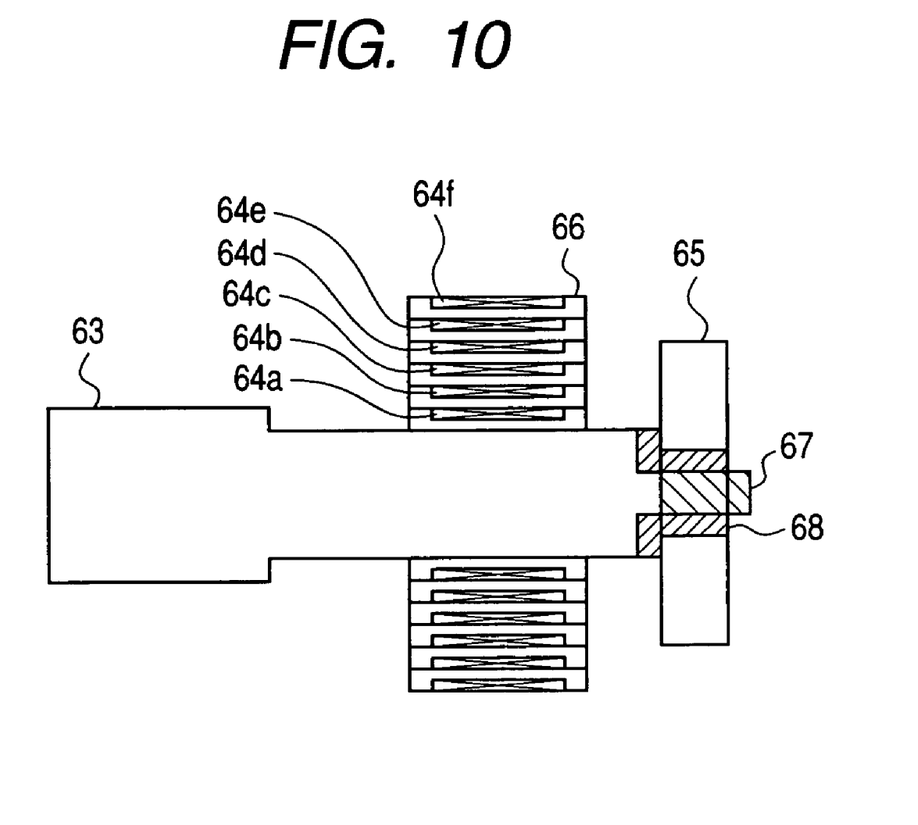
FIG. 10 shows an example of structure of the pole of the electromagnetic and electrostatic complex type multipole lens.

FIG. 9 and FIG. 10 show examples of the other structure of the pole forming the multipole lens to superpose plural multipole fields. The pole shown in FIG. 9 corresponds to the pole for electromagnetic type multipole lens, while the pole shown in FIG. 10 corresponds to the pole for the complex type multipole lens. The excitation coils for generating different kinds of magnetic fields are arranged in parallel in the poles shown in FIG. 7 and FIG. 8. However, plural excitation coils are arranged in parallel in the poles shown in FIG. 9 and FIG. 10.

Next, a function required for switching characteristics of the aberration corrector in the low acceleration region and high acceleration region will be explained. As explained above, both chromatic aberration and spherical aberration are included in the aberration generated in the low acceleration region and both chromatic aberration and spherical aberration must be removed to correct the aberration in the low acceleration region. Meanwhile, the spherical aberration occupies a greater part in the aberration in the high acceleration region and the aberration can almost be removed completely by removing the spherical aberration. In order to remove both chromatic aberration and spherical aberration, it is required to remove the aberration by introducing the trajectory-isolated charged particle beam into the complex type multipole lens. On the other hand, it is enough to use the electromagnetic type multipole lens in order to remove the spherical aberration and such aberration can be removed without superposing of electric field. As will be understood from FIG. 2 and FIG. 4, arrangements of the electromagnetic type multipole lens and the complex type multipole lens used in this second embodiment are almost identical. Accordingly, the complex type multipole lens shown in FIG. 4 can also be operated as the electromagnetic type multipole lens by turning OFF the voltage supplied to the voltage input terminal of the complex type multipole lens.

Therefore, the power supply 26 is modified to have a switching function to switch ON and OFF the supply of voltage to the aberration corrector in view of controlling ON and OFF of the relevant switch with the electro-optical system control unit 30. A setting value of the accelerating voltage of the charged particle beam, namely a setting value of the application voltage to the leadout electrode 3 is stored into a memory provided to the computer 102 or to the electro-optical system control unit 30. Moreover, a threshold value for switching the low acceleration region and high acceleration region is set via a management terminal 103 and is then stored to the memory provided in the computer 102 or electro-optical system control unit 30. The computer 102 compares the switching threshold value stored in the memory with the application voltage setting value to the leadout electrode and judges the operation as that in the high acceleration region when the application voltage is larger than the threshold value. Moreover, when the application voltage is smaller than the threshold value, the computer 102 judges the operation as that in the low acceleration region. Result of judgment is transmitted to the electro-optical system control unit 30 and the electro-optical system control unit 30 executes ON and OFF control of voltage supply by the power supply 26 on the basis of the result of judgment. Namely, when the signal transmitted from the compute 102 includes the information indicating operation in the high acceleration region, the computer 102 issues an instruction to the power supply 26 to stop supply of voltage to the voltage input terminal of the complex type multipole lenses 12, 13. When the signal transmitted from the computer 102 includes the information indicating operation in the low acceleration region, the computer 102 issues an instruction to the power supply 26 to start or continue supply of voltage to the voltage input terminal of the complex type multipole lenses 12 and 13.

With the structure explained above, the scanning charged particle optical apparatus which is capable of switching operation of the aberration corrector in the low acceleration region and high acceleration region can be realized. Operation of the complex type multipole lens as the electromagnetic field lens has the advantage that generation of deviation of beam from based on mismatch of axes of the electromagnetic type lens and the electrostatic type lens can be prevented. Moreover, since extra work for correcting beam deviation can be reduced, operationability of aberration corrector in the high acceleration region can be increased. Moreover, since it is no longer required to operate the voltage source, risk in generation of noise and discharge which will be assumed when the voltage is changed in accordance with the accelerating voltage can be eliminated. In addition, power consumption of aberration corrector in the high acceleration region can be reduced. In this embodiment, only one power supply 26 is used for supply of current and voltage to the multipole lenses 11 to 14, but current and voltage can also be supplied individually by providing plural current sources and voltage sources for each multiple lens.

Third Embodiment

Figure 11:
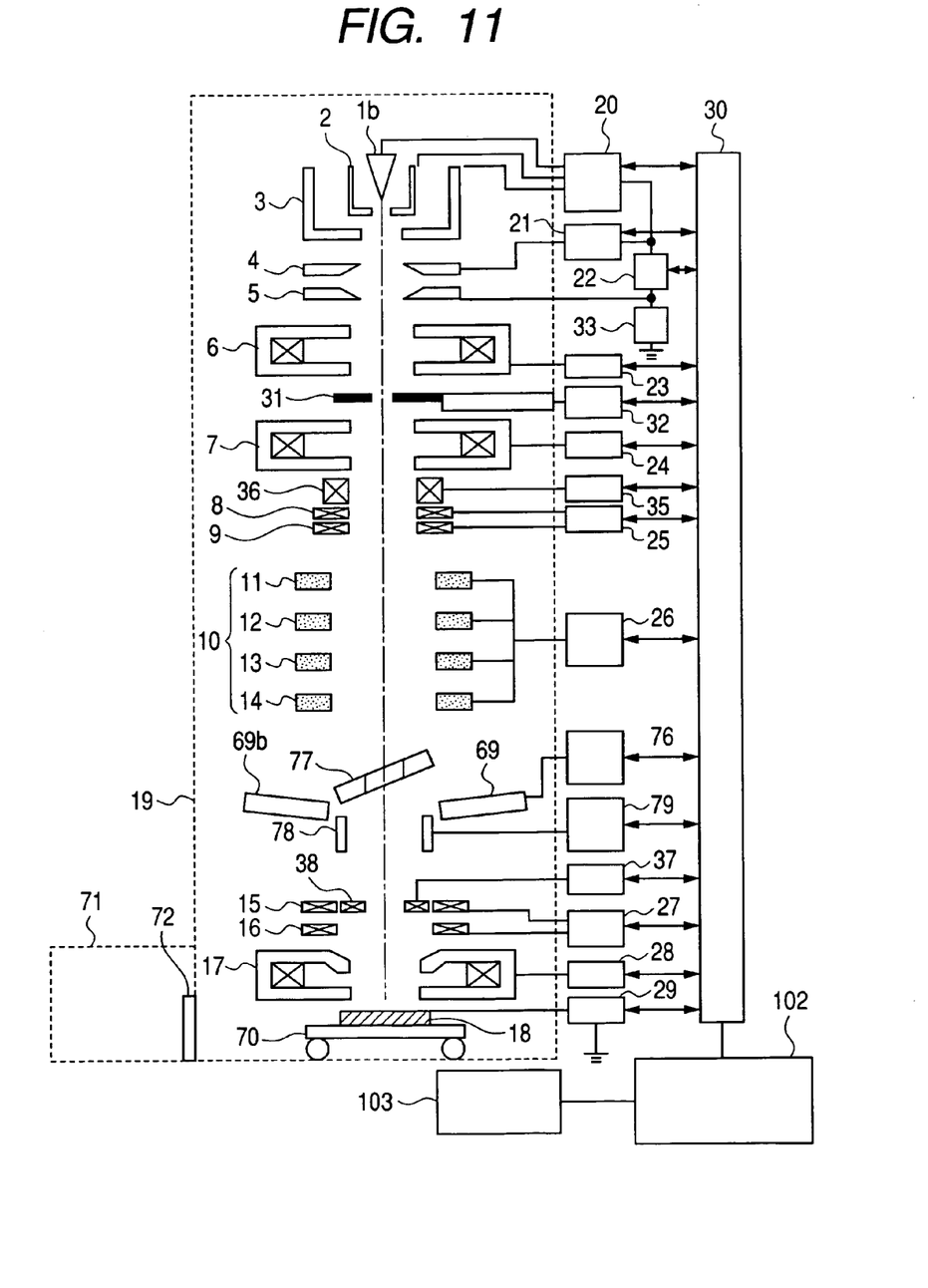
FIG. 11 shows an example of structure of a scanning charged particle optical apparatus of a third embodiment.

FIG. 11 shows an example of structure of a defective review SEM (DR-SEM) mounting the aberration corrector. FIG. 11 shows the structure attained by adding a detector 69b to the structure of FIG. 10. The detector 69b is arranged to the position different from the position symmetrical to the detector 69. Since the amount of secondary electrons detected from the detectors 69 and 69b depending on the structure of the specimen are different, the structure of specimen can be assumed and detected, on the contrary, by comparing the data obtained from both detectors. Data comparing operation can be executed with the computer 102.

What is claimed is:

1. A scanning charged particle optical microscope comprising:
    an irradiation optical system for scanning a specimen with a charged particle beam;
    a specimen stage for supporting the specimen;
    a detecting optical system for detecting secondary charged particles generated from the specimen by irradiation with the charged particle beam;
    a control unit to control the irradiation optical system; and
    a power supply including a current source and a voltage source;
    wherein the irradiation optical system includes a charged particle gun, an objective lens, and an aberration corrector arranged between the charged particle gun and the objective lens,
    wherein the aberration corrector includes a first pair of multipole lenses, each pole having a first coil, and a second pair of multipole lenses between the first pair of multipole lenses, each pole having a second coil and a voltage input terminal,
    wherein the first coils and the second coils are connected to the current source, and the voltage input terminal is connected to the voltage source, and
    wherein the control unit is arranged to control whether a voltage of the voltage source is applied to the voltage input terminal, in accordance with an accelerating voltage of the charged particle beam.

2. A scanning charged particle optical microscope according to claim 1,
    wherein when the accelerating voltage of the charged particle beam is equal to or higher than a predetermined value, the second pair of multipole lenses are operated as only magnetic lenses.

3. A scanning charged particle optical microscope according to claim 1,
    wherein the first coils are connected to each other and the second coils are connected to each other.

4. A scanning charged particle optical microscope according to claim 1,
    wherein each pole of the first pair of multipole lenses has a third coil;
    wherein each pole of the second pair of multipole lenses has a fourth coil, and
    wherein the third coils are connected to each other and the fourth coils are connected to each other.

5. A scanning charged particle optical microscope according to claim 4,
    wherein each pole of the first pair of multipole lenses has a fifth coil;
    wherein each pole of the second pair of multipole lenses has a sixth coil,
    wherein the fifth coils are connected to each other and the sixth coils are connected to each other,
    wherein the poles having the first coils, the poles having the third coils, and the poles having the fifth coils respectively form a dipole lens, a quadrupole lens, and an octupole lens, and wherein the poles having the second coils, the poles having the fourth coils, and the poles having the sixth coils respectively form a quadrupole lens, an octupole lens, and a dodecapole lens.

6. A scanning charged particle optical microscope comprising:
- an irradiation optical system for scanning a specimen with a charged particle beam,
- a specimen stage for supporting the specimen;
- a detecting optical system for detecting secondary charged particles generated from the specimen by irradiation with the charged particle beam,
- a control unit arranged to control the irradiation optical system; and
- a power supply including a current source and a voltage source,
- wherein the irradiation optical system includes a charged particle gun, an objective lens, and an aberration corrector arranged between the charged particle gun and the objective lens,
- wherein the aberration corrector includes a first pair of multipole lenses, each pole having a first coil, and a second pair of multipoles lenses between the first pair of multipole lenses, each pole having a second coil and a voltage input terminal,
- wherein the first coils and the second coils are connected to the current source and the voltage input terminal is connected to the voltage source, and
- wherein the control unit is arranged to controllably stop supply of the voltage from the voltage source to the voltage input terminal when an accelerating voltage of the charged particle beam is equal to or higher than a predetermined value.

7. A scanning charged particle optical microscope according to claim 6,
wherein when the accelerating voltage of the charged particle beam is equal to or higher than the predetermined value, the second pair of multipole lenses are operated as only magnetic lenses.

8. A scanning charged particle optical microscope according to claim 6,
wherein the first coils are connected to each other and the second coils are connected to each other.

9. A scanning charged particle optical microscope according to claim 6,
wherein each pole of the first pair of multipole lenses has a third coil;
wherein each pole of the second pair of multipole lenses has a fourth coil, and
wherein the third coils are connected to each other and the fourth coils are connected to each other.

10. A scanning charged particle optical microscope according to claim 9,
wherein each pole of the first pair of multipole lenses has a fifth coil;
wherein each pole of the second pair of multipole lenses has a sixth coil,
wherein the fifth coils are connected to each other and the sixth coils are connected to each other,
wherein the poles having the first coils, the poles having the third coils, and the poles having the fifth coils respectively form a dipole lens, a quadrupole lens, and an octupole lens, and
wherein the poles having the second coils, the poles having the fourth coils, and the poles having the sixth coils respectively form a quadrupole lens, an octupole lens, and a dodecapole lens.

* * * * *